(12) United States Patent
Cao et al.

(10) Patent No.: US 11,165,453 B2
(45) Date of Patent: Nov. 2, 2021

(54) RADIO FREQUENCY POWER AMPLIFIER CONTROL DEVICE

(71) Applicant: SHANGHAI UNITED IMAGING HEALTHCARE CO., LTD., Shanghai (CN)

(72) Inventors: Bin Cao, Shanghai (CN); Xu Chu, Shanghai (CN); Jifeng Chen, Shanghai (CN); Peng Zhang, Shanghai (CN); Yinqi Wang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 16/726,865

(22) Filed: Dec. 25, 2019

(65) Prior Publication Data
US 2021/0058103 A1    Feb. 25, 2021

(30) Foreign Application Priority Data

Aug. 20, 2019    (CN) .......................... 201910768760.X
Aug. 20, 2019    (CN) .......................... 201921357717.6

(51) Int. Cl.
*H04B 1/04*    (2006.01)
*G01R 33/36*    (2006.01)

(52) U.S. Cl.
CPC ....... *H04B 1/0475* (2013.01); *G01R 33/3614* (2013.01); *H04B 2001/0416* (2013.01)

(58) Field of Classification Search
CPC .............. H04B 1/0475; H04B 1/0483; H04B 2001/0416; H04B 2001/0408; H04B 2001/0433; H04B 2001/0441; G01R 33/3614

See application file for complete search history.

(56) References Cited

U.S. PATENT DOCUMENTS

| | | | | |
|---|---|---|---|---|
| 6,108,364 A | * | 8/2000 | Weaver, Jr. | ........ H04B 7/15535 375/130 |
| 6,275,685 B1 | | 8/2001 | Wessel et al. | |
| 6,625,202 B1 | * | 9/2003 | Sudo | .................... H04B 1/7115 370/342 |
| 6,774,719 B1 | * | 8/2004 | Wessel | .................. H03F 1/0222 330/10 |
| 2002/0061074 A1 | | 5/2002 | Kusunoki | |

(Continued)

FOREIGN PATENT DOCUMENTS

| | | |
|---|---|---|
| CN | 103701415 B | 2/2017 |
| CN | 106452369 A | 2/2017 |

OTHER PUBLICATIONS

Extended European Search Report in European Application No. 20188268.5 dated Jan. 18, 2021, 10 pages.

*Primary Examiner* — Nguyen T Vo
(74) *Attorney, Agent, or Firm* — Metis IP LLC

(57) ABSTRACT

The present disclosure relates to a radio frequency power amplifier (RFPA) control device. The RFPA control device may include an input signal processing module configured to process an input signal into two signals. A first signal may be used for signal detection, and a second signal may be used for signal amplification. The RFPA control device may also include a delay module. The delay module may be disposed between the input signal processing module and an adjustment module. The delay module may be configured to determine a delay of the second signal such that the second signal and the control signal roughly simultaneously reach the adjustment module.

18 Claims, 11 Drawing Sheets

(56) References Cited

U.S. PATENT DOCUMENTS

2005/0079835 A1* 4/2005 Takabayashi ......... H03F 1/0255
455/127.1
2008/0268794 A1* 10/2008 Mege .................... H03F 1/3247
455/114.3
2012/0176667 A1* 7/2012 He ...................... H04B 10/2942
359/344

* cited by examiner

RADIO FREQUENCY POWER AMPLIFIER CONTROL DEVICE

CROSS-REFERENCE TO THE RELATED APPLICATIONS

This application claims priority of Chinese Application No. 201910768760.X, filed on Aug. 20, 2019, and Chinese Application No. 201921357717.6, filed on Aug. 20, 2019, the contents of each of which are hereby incorporated by reference.

TECHNICAL FIELD

The present disclosure generally relates to the field of radio frequency power amplification, and more specifically relates to a radio frequency power amplifier (RFPA) and a RFPA control device.

BACKGROUND

Magnetic resonance imaging (MRI), a non-invasive imaging technique that can obtain image data of internal structures of an object without performing an invasive procedure on the object, which has a broad range of uses in the medical field. A radio frequency power amplifier (RFPA) is an important component of an MRI system. The RFPA receives a series of pulses generated by an external RF source as its input signals, and generates a series of amplified pulses as its output signals. The output signals are used to drive RF coils. Thus, the performance of the RFPA may affect the quality of image(s) generated by the MRI system.

The RFPA is composed of multiple nonlinear elements, and accordingly the RFPA generally exhibits nonlinear characteristics. Specifically, the RFPA shows various amplitude amplification capabilities (or amplification factor) and outputs different phases on the basis of the different sizes of radio frequency signal power (e.g., different series of pulses), thus, resulting in non-linearity. Medical staff often wants the RFPA to be linear. That is, for different sizes of radio frequency signal power, the radio frequency power amplification capability is consistent, with the same amplitude magnification and the same output phase. Therefore, an additional design adjustment device is required to adjust the amplitude magnification and output phase of the RFPA to achieve constant gain and constant phase, which is called nonlinear correction.

The calibration process of the traditional nonlinear correction device mainly includes three steps: first, detecting the input radio frequency signal; second, calculating the adjustment amount of the input radio frequency signal that needs to be adjusted; and third, compensating the gain and output phase of the radio frequency power amplifier itself through the regulator.

However, the conventional nonlinear correction device has a big problem: the correction itself comprises data processing and transmission of control signals, resulting in that the time at which the control signal reaches the adjustment device lags behind the input timing of the radio frequency signal (i.e., the time at which the radio frequency signal reaches the adjustment device). Especially, when the input radio frequency signal is a rapidly changing modulated signal, the time interval caused by the hysteresis leads to poor nonlinear correction results of the RFPA, which leads to poor imaging stability and even artifacts of the MRI system. Therefore, it is necessary to design a control device (also referred to as an RFPA control device) coordinate with the RFPA to achieve constant gain and constant phase, which is also known as nonlinear correction.

SUMMARY

In one aspect of the present disclosure, a radio frequency power amplifier control device is provided. The radio frequency power amplifier control device may be coupled to a radio frequency power amplification module. The radio frequency power amplifier control device may include an input signal processing module and a delay module. The input signal processing module may be configured to process an input signal into at least two signals. A first signal of the at least two signals may be used for signal detection. A second signal of the at least two signals may be used for signal amplification. The delay module may be disposed between the input signal processing module and an adjustment module. The delay module may be configured to determine a delay of the second signal such that the second signal and the control signal roughly simultaneously reach the adjustment module.

In some embodiments, the radio frequency power amplifier control device may also include the adjustment module and a signal processing and control module. The adjustment module may be connected to the input signal processing module and the radio frequency power amplification module, respectively. The adjustment module may be configured to adjust at least one feature of the second signal. The signal processing and control module may be connected to the input signal processing module and the adjustment module, respectively. The signal processing and control module may be configured to generate a control signal based on at least one feature of the first signal. The control signal may be configured to control a degree of the adjustment of the at least one feature of the second signal.

In some embodiments, the signal processing and control module may include an input signal detection sub-module, and a signal processing and control sub-module. The input signal detection sub-module may be connected to the input signal processing module and configured to detect the at least one feature of the first signal. The signal processing and control sub-module may be connected to the input signal detection sub-module and the adjustment module, respectively. The signal processing and control sub-module may be configured to generate the control signal based on the at least one feature of the detected first signal.

In some embodiments, the input signal detection sub-module may include at least one of a detector, a diode, or a phase discriminator.

In some embodiments, the signal processing and control sub-module may include an adjustable delay unit configured to impose an adjustable delay on the control signal.

In some embodiments, a total transmission time from a moment that the first signal is transmitted to the signal processing and control module to a moment that the control signal is transmitted to the adjustment module may be composed of a first transmission time, a second transmission time, a third transmission time, and a fourth transmission time. The first transmission time may be a time that the input signal detection sub-module detects the at least one feature of the first signal. The second transmission time may be a time that the signal processing and control sub-module processes the first signal and generates the control signal. The third transmission time may be a time of transmitting the control signal to the adjustment module. The fourth transmission time may be an adjustable delay time imposed by the adjustable delay unit of the signal processing and control sub-module.

In some embodiments, the adjustable delay unit may adjust the fourth transmission time to change a time difference between the total transmission time and the delay of the second signal such that the second signal and the control signal roughly simultaneously reach the adjustment module.

In some embodiments, the adjustment module may include at least one of a controllable attenuator, or a phase shifter.

In some embodiments, the at least one feature of the first signal may include amplitude and/or phase. The at least one feature of the second signal may include amplitude and/or phase.

In some embodiments, the radio frequency power amplification module may be configured to receive and amplify the adjusted second signal to generate an output signal.

In some embodiments, the radio frequency power amplifier control device may include an output signal processing module. The output signal processing module may be connected to the radio frequency power amplification module. The output signal processing module may be configured to process the output signal into at least two output signals. A first output signal of the at least two output signals may be used for signal detection, and a second output signal of the at least two output signals may be transmitted to a load.

In some embodiments, the signal processing and control module may further include an output signal detection sub-module. The output signal detection sub-module may be connected to the output signal processing module and the signal processing and control sub-module, respectively. The output signal detection sub-module may be configured to detect at least one feature of the first output signal. The signal processing and control sub-module may be configured to generate the control signal based on the at least one feature of the first signal and the at least one feature of the first output signal.

In some embodiments, the delay module may include at least one of a LC filter, a surface acoustic wave filter, or a delay line.

In another aspect of the present disclosure, a method for controlling a radio frequency power amplifier is provided. The method may be implemented on a computing device including at least one processor, at least one storage device, and a communication platform connected to a network. The method may include processing, by an input signal processing module, an input signal into at least two signals, wherein a first signal of the at least two signals is used for signal detection, and a second signal of the at least two signals is used for signal amplification; generating, by a signal processing and control module, a control signal based on at least one feature of the first signal; determining, by a delay module, a delay of the second signal such that the second signal and the control signal roughly simultaneously reach an adjustment module; and adjusting, by the adjustment module, at least one feature of the second signal based on the control signal.

In some embodiments, the generating a control signal based on at least one feature of the first signal may include detecting the at least one feature of the first signal, and generating the control signal based on the at least one feature of the detected first signal.

In some embodiments, the method may also include amplifying the adjusted second signal to generate an output signal by a radio frequency power amplification module.

In some embodiments, the method may include processing the output signal into at least two output signals by an output signal processing module. A first output signal of the at least two output signals may be used for signal detection, and a second output signal of the at least two output signals may be transmitted to a load.

In some embodiments, the generating a control signal based on at least one feature of the first signal may include detecting at least one feature of the first output signal, and generating the control signal based on the at least one feature of the first signal and the at least one feature of the first output signal.

In some embodiments, the delay module may include at least one of a LC filter, a surface acoustic wave filter, or a delay line.

In yet another aspect of the present disclosure, a radio frequency power amplifier is provided. The radio frequency power amplifier may include a radio frequency power amplifier control device and a radio frequency power amplification module. The radio frequency power amplifier control device may include an input signal processing module, an adjustment module, a signal processing and control module, and a delay module. The input signal processing module may be configured to process an input signal into at least two signals. A first signal of the at least two signals may be used for signal detection, and a second signal of the at least two signals may be used for signal amplification. The adjustment module may be connected to the input signal processing module and configured to adjust at least one feature of the second signal. The signal processing and control module may be connected to the input signal processing module and the adjustment module, respectively. The signal processing and control module may be configured to generate a control signal based on at least one feature of the first signal. The control signal may be configured to control a degree of the adjustment of the at least one feature of the second signal. The delay module may be disposed between the input signal processing module and the adjustment module. The delay module may be configured to determine a delay of the second signal such that the second signal and the control signal roughly simultaneously reach the adjustment module. The radio frequency power amplification module may be configured to receive and amplify the adjusted second signal to generate an output signal.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by other expression if they achieve the same purpose.

Figure 2:
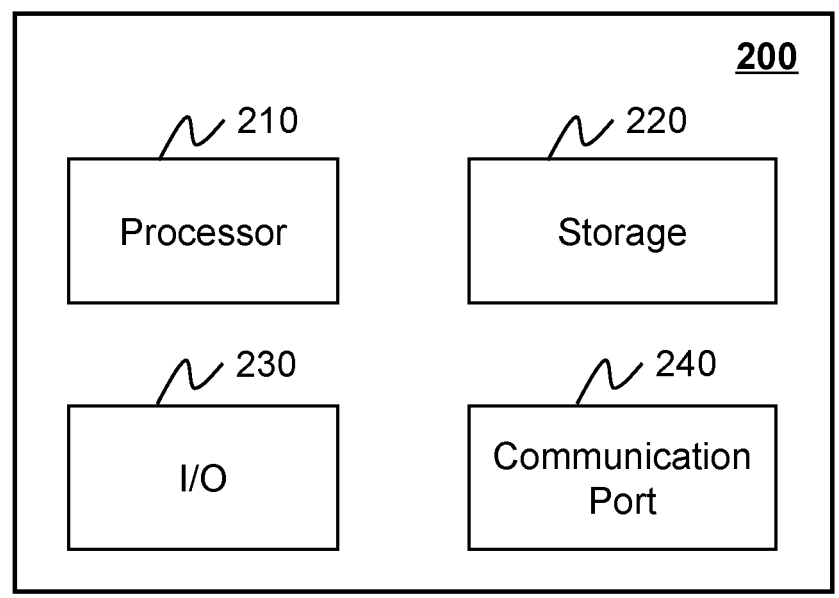
FIG. 2 is a schematic diagram illustrating exemplary hardware and/or software components of a computing device on which the processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 210 as illustrated in FIG. 2) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

An aspect of the present disclosure relates to a radio frequency power amplifier (RFPA) control device configured to adjust an input signal to implement a nonlinear correction of a radio frequency power amplifier (RFPA). The RFPA control device may be coupled to a radio frequency power amplification module. The RFPA control device may include an input signal processing module, an adjustment module, a signal processing and control module, and a delay module. The adjustment module may be connected to the input signal processing module and the radio frequency power amplification module, respectively. The signal processing and control module may be connected to the input signal processing module and the adjustment module, respectively. The delay module may be disposed between the input signal processing module and the adjustment module.

The input signal processing module may be configured to process an input signal into two signals. A first signal may be used for signal detection, and a second signal may be used for signal amplification. The adjustment module may be configured to adjust at least one feature of the second signal. The signal processing and control module may be configured to generate a control signal based on at least one feature of the first signal. The control signal may be configured to control a degree of the adjustment of the at least one feature of the second signal. The delay module may be configured to determine a delay of the second signal such that the second signal and the control signal roughly simultaneously reach the adjustment module.

In some embodiments, the RFPA can be used in various applications. Examples of such applications may include broadcasting, satellite communications, cellular communications. In some embodiments, the RFPA may be used in a magnetic resonance imaging (MRI) system. For example, the RFPA may amplify an input signal and generate an amplified output signal. The amplified output signal may be transmited to RF coils. More descriptions may be found in, e.g., FIG. 1 and the descriptions thereof.

Figure 1:
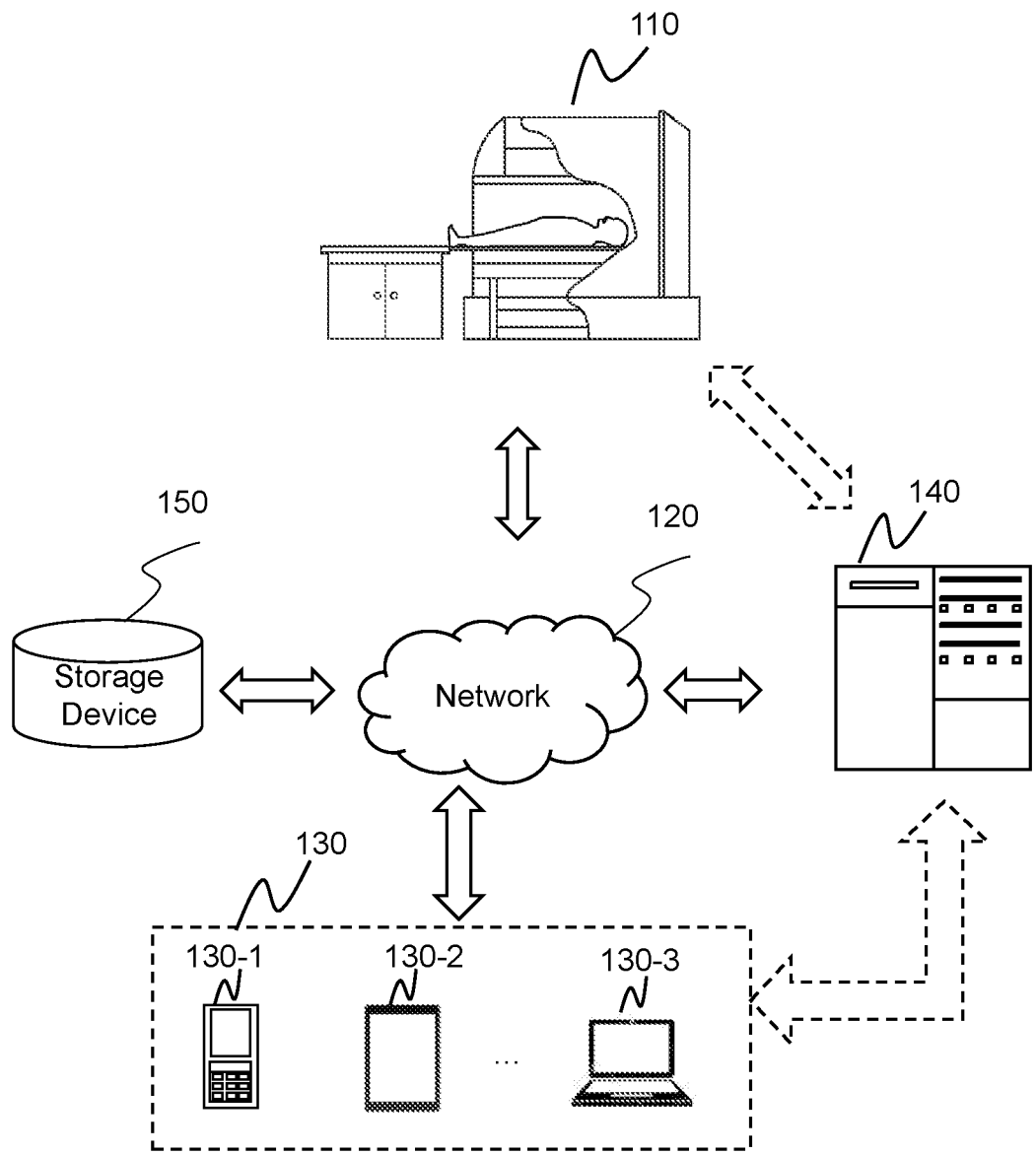
FIG. 1 is a schematic diagram illustrating an exemplary MRI system according to some embodiments of the present disclosure.

FIG. 1 is a schematic diagram illustrating an exemplary MRI system according to some embodiments of the present disclosure. As illustrated, the MRI system 100 may include an MRI scanner 110, a network 120, one or more terminals 130, a processing device 140, and a storage device 150. The components in the MRI system 100 may be connected in various ways. Merely by way of example, as illustrated in FIG. 1, the MRI scanner 110 may be connected to the processing device 140 through the network 120. As another example, the MRI scanner 110 may be connected to the processing device 140 directly as indicated by the bi-directional arrow in dotted lines linking the MRI scanner and the processing device 140. As a further example, the storage device 150 may be connected to the processing device 140 directly or through the network 120. As still a further example, one or more terminals 130 may be connected to the processing device 140 directly (as indicated by the bi-directional arrow in dotted lines linking the terminal 130 and the processing device 140) or through the network 120.

The MRI scanner 110 may scan a subject located within its detection region and generate a plurality of data relating to the subject. In the present disclosure, "subject" and "object" are used interchangeably. The MRI scanner 110 may include a magnet assembly, a gradient coil assembly, and a radiofrequency (RF) coil assembly (not shown in FIG. 1). In some embodiments, the MRI scanner 110 may be a close-bore scanner or an open-bore scanner.

The magnet assembly may generate a first magnetic field (also referred to as a main magnetic field) for polarizing the subject to be scanned. The magnet assembly may include a permanent magnet, a superconducting electromagnet, a resistive electromagnet, etc. In some embodiments, the magnet assembly may further include shim coils for controlling the homogeneity of the main magnetic field.

The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), Y direction (Gy), and Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated. The RF receiver coils may receive MR signals from the subject. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils.

In some embodiments, the MRI scanner 110 may also include a radio frequency power amplifier (RFPA). The RFPA may receive a series of pulses generated by an external RF source as the input signals, and generate a series of amplified pulses as the output signals. The output signals are used to drive RF coils. In some embodiments, the performance of the RFPA may affect the quality of image(s) generated by the MRI system. To ensure the RFPA having a linear amplification ability, a RFPA control device is used to adjust the input signal before amplified by the RFPA. Details regarding the RFPA control device may be found elsewhere in the present disclosure (e.g., FIGS. 4A-6C and the descriptions thereof).

The network 120 may facilitate exchange of information and/or data. In some embodiments, one or more components of the MRI system 100 (e.g., the MRI scanner 110, the terminal 130, the processing device 140, or the storage device 150) may send information and/or data to another component(s) in the MRI system 100 via the network 120. For example, the processing device 140 may cause, via the network 120, an input signal processing module to process an input signal into at least two signals. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, an optical fiber network, a telecommunications network, an intranet, an Internet, a local area network (LAN), a wide area network (WAN), a wireless local area network (WLAN), a metropolitan area network (MAN), a wide area network (WAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired or wireless network access points such as base stations and/or internet exchange points through which one or more components of the MRI system 100 may be connected to the network 120 to exchange data and/or information.

The terminal 130 include a mobile device 130-1, a tablet computer 130-2, a laptop computer 130-3, or the like, or any combination thereof. In some embodiments, the mobile device 130-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, footgear, eyeglasses, a helmet, a watch, clothing, a backpack, an accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a HoloLens, a Gear VR, etc. In some embodiments, the terminal 130 may remotely operate the MRI scanner 110. In some embodiments, the terminal 130 may operate the MRI scanner 110 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

In some embodiments, the processing device 140 may process data obtained from the MRI scanner 110, the terminal 130, or the storage device 150. For example, the processing device 140 may cause an adjustment module to adjust at least one feature of a signal (e.g., a second signal) based on a control signal. The processing device 140 may be a central processing unit (CPU), a digital signal processor (DSP), a system on a chip (SoC), a microcontroller unit (MCU), or the like, or any combination thereof. In some embodiments, the processing device 140 may be a single server or a server group. The server group may be centralized or distributed. In some embodiments, the processing device 140 may be local or remote. For example, the processing device 140 may access information and/or data stored in the MRI scanner 110, the terminal 130, and/or the storage device 150 via the network 120. As another example, the processing device 140 may be directly connected to the MRI scanner 110, the terminal 130, and/or the storage device 150, to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 200 having one or more components illustrated in FIG. 2 in the present disclosure.

The storage device 150 may store data and/or instructions. In some embodiments, the storage device 150 may store data obtained from the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the terminal 130, the processing device 140). One or more components of the MRI system 100 may access the data or instructions stored in the storage device 150 via the network 120. In some embodiments, the storage device 150 may be directly connected to or communicate with one or more components of the MRI system 100 (e.g., the terminal 130, the processing device 140). In some embodiments, the storage device 150 may be part of the processing device 140.

FIG. 2 is a schematic diagram illustrating exemplary hardware and/or software components of a computing device on which the processing device 140 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and, when executing the instructions, cause the processing device 140 to perform functions of the processing device 140 in accordance with techniques described herein. The computer instructions may include, for example, routines, programs, objects, components, signals, data structures, procedures, modules, and functions, which perform particular functions described herein. In some embodiments, the processor 210 may process data and/or images obtained from the MRI scanner 110, the terminal 130, the storage device 150, and/or any other component of the MRI system 100. For example, the processor 210 may cause an input signal processing module to process an input signal into at least two signals. A first signal of the at least two signals may be used for signal detection, and a second signal of the at least two signals may be used for signal amplification. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MRI scanner 110, the terminal 130, the storage device 150, or any other component of the MRI system 100. In some embodiments, the storage 220 may include a mass storage device, removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure.

The I/O 230 may input or output signals, data, and/or information. In some embodiments, the I/O 230 may enable a user interaction with the processing device 140. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected to a network (e.g., the network 120) to facilitate data communications. The communication port 240 may establish connections between the processing device 140 and the MRI scanner 110, the terminal 130, or the storage device 150. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMAX, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
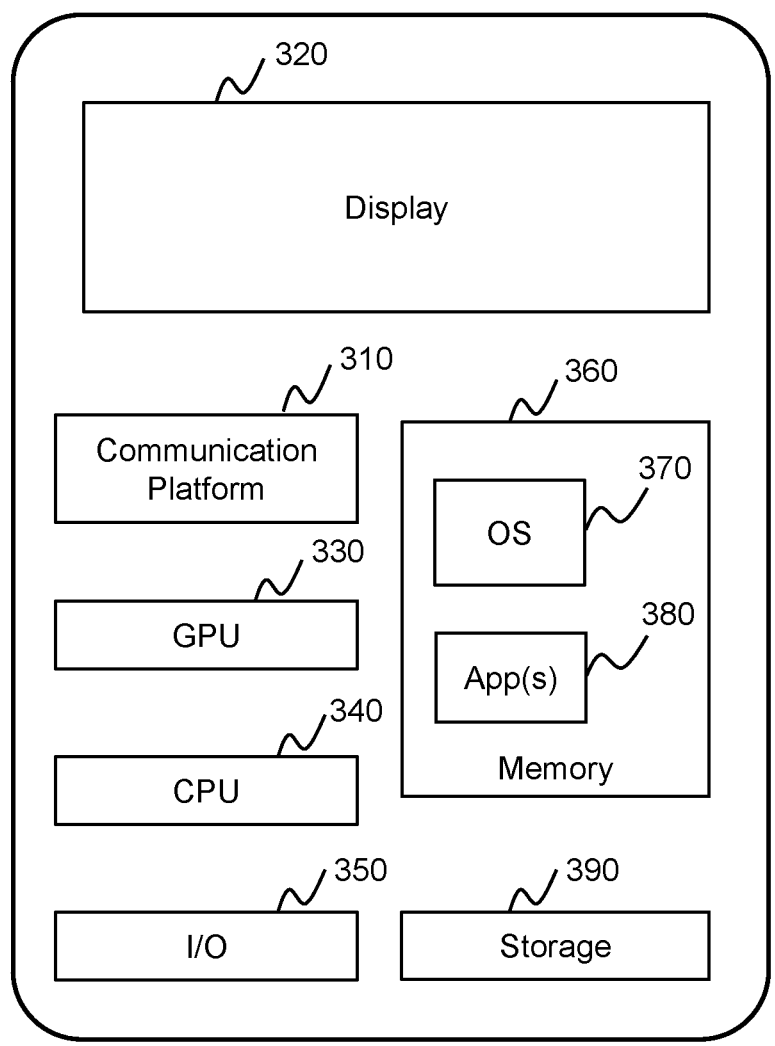
FIG. 3 is a schematic diagram illustrating exemplary hardware and/or software components of a mobile device according to some embodiments of the present disclosure.

FIG. 3 is a schematic diagram illustrating exemplary hardware and/or software components of a mobile device according to some embodiments of the present disclosure. As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 140. User interactions with the information stream may be achieved via the I/O 350 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the RFPA control device as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 4A:
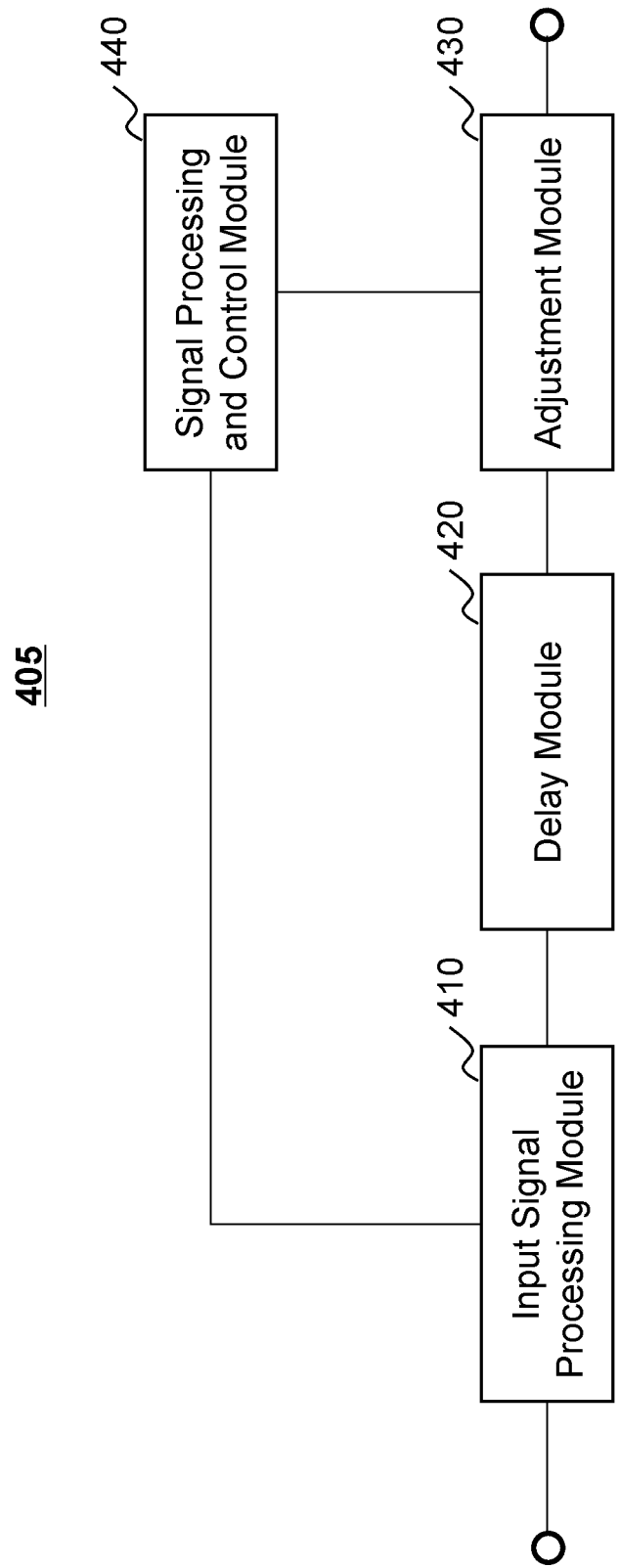
FIG. 4A is a schematic diagram illustrating an exemplary radio frequency power amplifier (RFPA) control device according to some embodiments of the present disclosure.
Figure 4B:
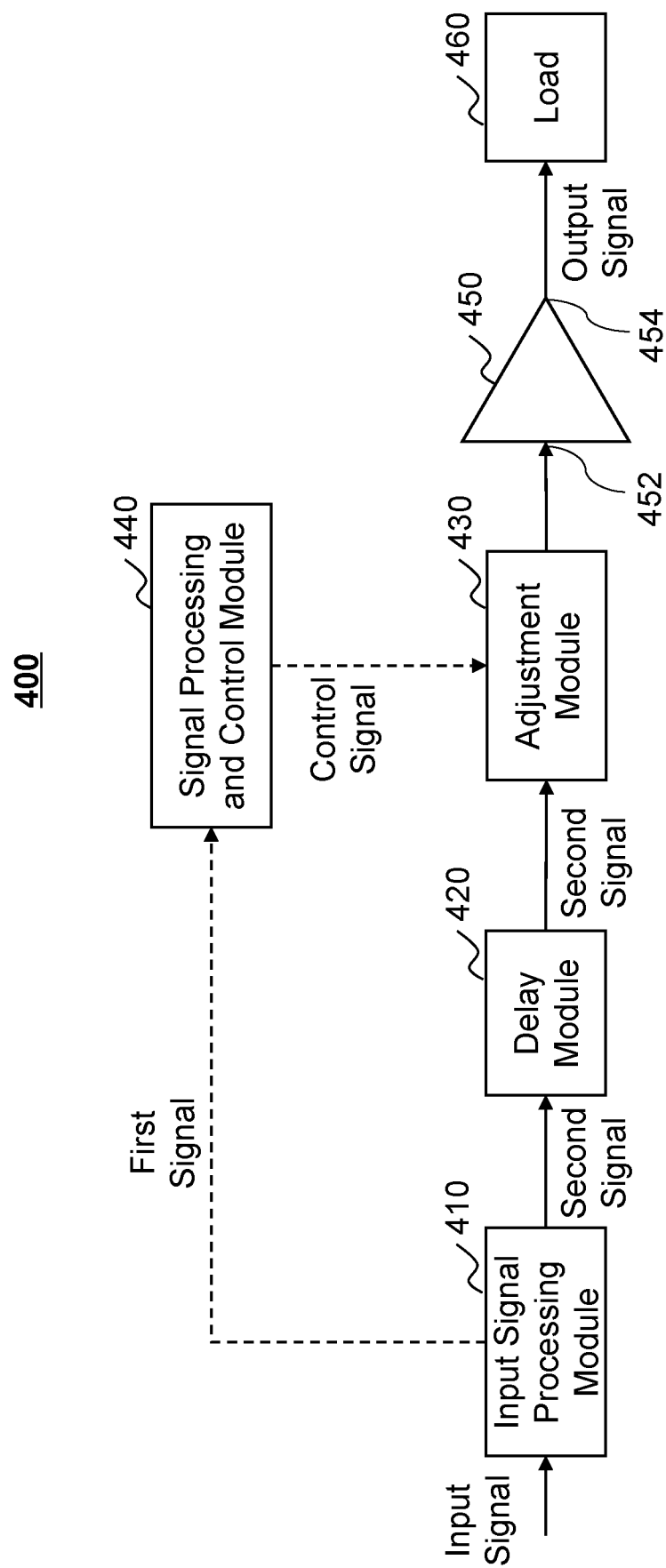
FIG. 4B is a schematic diagram illustrating an exemplary radio frequency power amplifier (RFPA) according to some embodiments of the present disclosure.

FIG. 4A is a schematic diagram illustrating an exemplary radio frequency power amplifier (RFPA) control device 405 according to some embodiments of the present disclosure. FIG. 4B is a schematic diagram illustrating an exemplary radio frequency power amplifier (RFPA) 400 according to some embodiments of the present disclosure. The RFPA 400 may include a RFPA control device (e.g., the RFPA control device 405 as illustrated in FIG. 4A), a radio frequency power amplification module 450, and a load 460. The RFPA control device 405 may be configured to adjust an input signal to implement a nonlinear correction of the radio frequency power amplification module 450. The radio frequency power amplification module 450 may be configured to amplify the adjusted input signal and generate an output signal. In some embodiments, an amplification function (which is nonlinear) of the radio frequency power amplification module 450 may be pre-determined via tests. Then a correction function may be determined based on the amplification function. The RFPA control device 405 may adjust the input signal according to the correction function. Then the radio frequency power amplification module 450 may amplify the adjusted input signal to generate the output signal that satisfies user's demand. The output signal may be transmitted to the load 460 (e.g., RF coils). Unless otherwise stated, like reference numerals in FIGS. 4A and 4B refer to like components having the same or similar functions.

As shown in FIGS. 4A and 4B, the RFPA control device 405 may include an input signal processing module 410, an adjustment module 430, and a signal processing and control module 440. The adjustment module 430 may be connected to the input signal processing module 410 and the radio frequency power amplification module 450, respectively. Specifically, the first end of the adjustment module 430 may be connected to the input signal processing module 410, and the second end of the adjustment module 430 may be connected to the radio frequency power amplification module 450. The signal processing and control module 440 may be connected to the input signal processing module 410 and the adjustment module 430, respectively. Specifically, the first end of the signal processing and control module 440 may be connected to the input signal processing module 410, and the second end of the signal processing and control module 440 may be connected to the adjustment module 430. The RFPA control device 400 may also include a delay module 420. The delay module 420 may be disposed between the input signal processing module 410 and the adjustment module 430.

The input signal processing module 410 may be configured to process an input signal into at least two signals. A first signal (also referred to as first input signal) of the at least two signals may be used for signal detection, and a second signal (also referred to as second input signal) of the at least two signals may be used for signal amplification. In some embodiments, the input signal processing module 410 may be a power divider, a couper, or the like, or a combination thereof. The power divider may divide the input signal into two equal or unequal signals (i.e., the first signal, the second signal). The couper may extract a portion of signal from the input signal as the first signal, and the remaining signal as the second signal. In some embodiments, the first signal may be transmitted to the signal processing and control module 440. The second signal may be transmitted to the delay module 420.

The signal processing and control module 440 may be configured to generate a control signal based on at least one feature of the first signal. The control signal may be used to control a degree of the adjustment of the at least one feature of the second signal. In some embodiments, the at least one feature of the first signal may include amplitude, phase, or the like, or any combination thereof. In some embodiments, the signal processing and control module 440 may include one or more sub-modules (such as an input signal detection sub-module, a signal processing and control sub-module, an output signal detection sub-module) configured to determine the control signal. More descriptions of the sub-modules may be found elsewhere in the present disclosure (e.g., FIGS. 5A, 5B, 6A, and 6B, and the descriptions thereof).

The adjustment module 430 may be configured to adjust at least one feature of the second signal. In some embodiments, the at least one feature of the second signal may include amplitude, phase, or the like, or any combination thereof. The adjustment module 430 may include a controllable attenuator, a phase shifter, or the like. The controllable attenuator may be used to adjust the amplitude of the second signal. The phase shifter may be used to adjust the phase of the second signal. In some embodiments, the adjustment module 430 may transmit the adjusted second signal into the radio frequency power amplification module 450 for amplification. For example, the radio frequency power amplification module 450 may amplify the amplitude of the adjusted second signal and/or adjust the phase of the second signal to generate the output signal.

As shown in FIG. 4B, the first signal may be transmitted to the signal processing and control module 440 and processed by the signal processing and control module 440 to generate the control signal. The control signal may then be transmitted to the adjustment module 430. In some embodiments, the generation of the control signal may take a certain amount of time, while the second signal may be directly transmitted to the adjustment module 430. Thus, the moment that the control signal reaches the adjustment module 430 may be significantly later than the moment that the second signal reaches the adjustment module 430, which may result in poor nonlinear correction effects of the radio frequency power amplification module 450 (especially for fast response signals), and further may cause imaging artifacts in an MRI system (e.g., the MRI system 100). Thus, the delay module 420 may be disposed between the input signal processing module 410 and the adjustment module 430 to delay the moment that the second signal reaches the adjustment module 430.

The delay module 420 may be configured to determine a delay of the second signal such that the second signal and the control signal may roughly simultaneously reach the adjustment module 430. As used herein, "roughly simultaneously reaching" refers to a time difference between the moment that the second signal reaches the adjustment module 430 and the moment that the control signal reaches the adjustment module 430 is less than several nanoseconds (e.g., 10 nanoseconds, 20 nanoseconds, 50 nanoseconds). The delay module 420 is configured to delay the time when the inputted to-be-amplified signal reaches the adjustment module 430. For example, the delay module 420 may adjust a time difference between the moment that the second signal reaches the adjustment module 430 and the moment that the control signal reaches the adjustment module 430. In some embodiments, the time difference may be 0. In this case, the second signal and the control signal may simultaneously reach the adjustment module 430. Alternatively, the time difference may be several nanoseconds, several microseconds, or the like. In this case, the second signal and the control signal may be regarded as approximately simultaneously reaching the adjustment module 430. The delay module 420 may include a LC filter, a surface acoustic wave filter (SAWF), a delay line, or the like, or any combination thereof. The delay time may be determined when the delay module 420 may be fabricated. In some embodiments, a plurality of delay modules with different delay times may be fabricated according to actual demands.

In some embodiments of the present disclosure, the delay module 420 may be disposed between the input signal processing module 410 and the adjustment module 430 to delay the transmission of the second signal, which may counteract the time difference between the moment that the control signal reaches the adjustment module 430 and the moment that the second signal reaches the adjustment module 430, thus achieving good nonlinear correction effects and further avoiding imaging artifacts in an MRI system (e.g., the MRI system 100).

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the RFPA may be applied to an MRI system (e.g., the MRI system 100). Alternatively or additionally, the RFPA may be used in various applications, such as broadcasting, satellite communications, cellular communications, or the like.

Figure 5A:
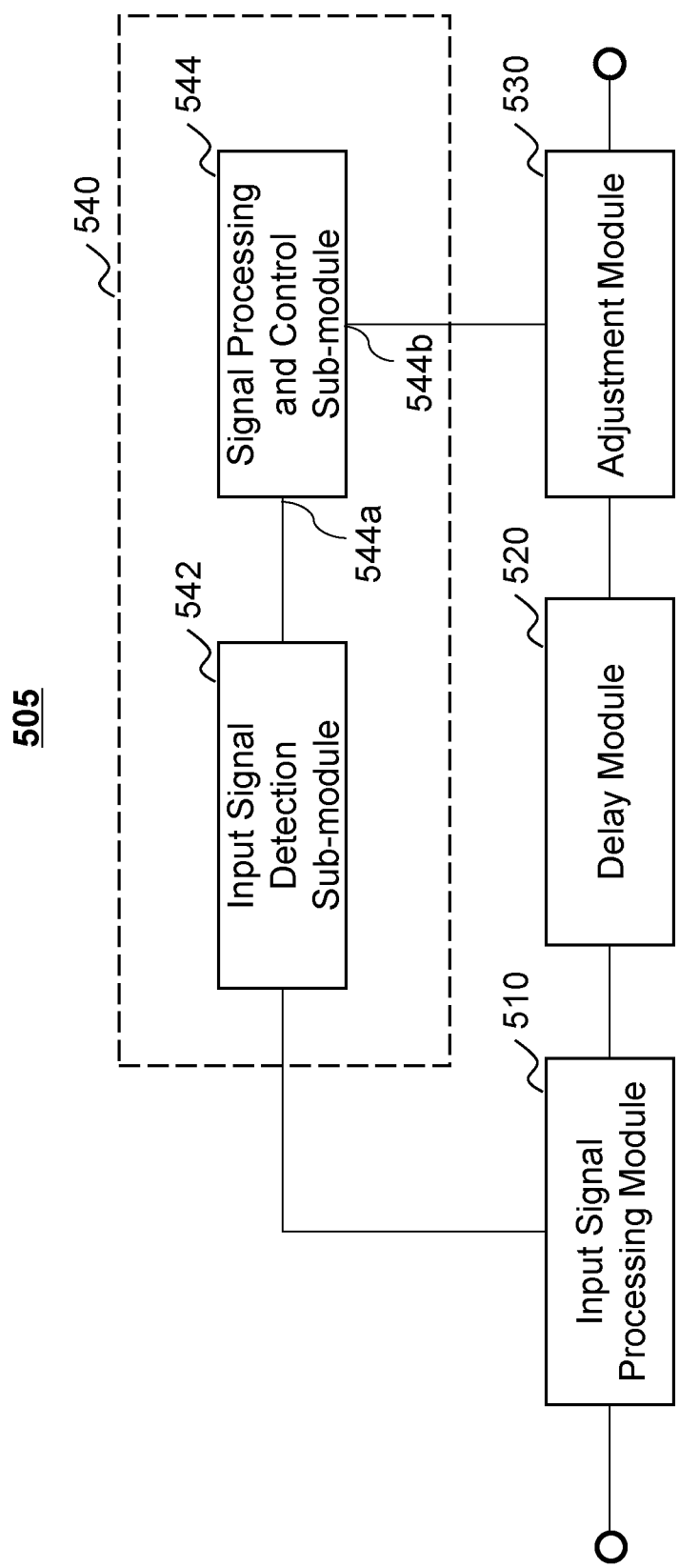
FIG. 5A is a schematic diagram illustrating an exemplary radio frequency power amplifier (RFPA) control device according to some embodiments of the present disclosure.
Figure 5B:
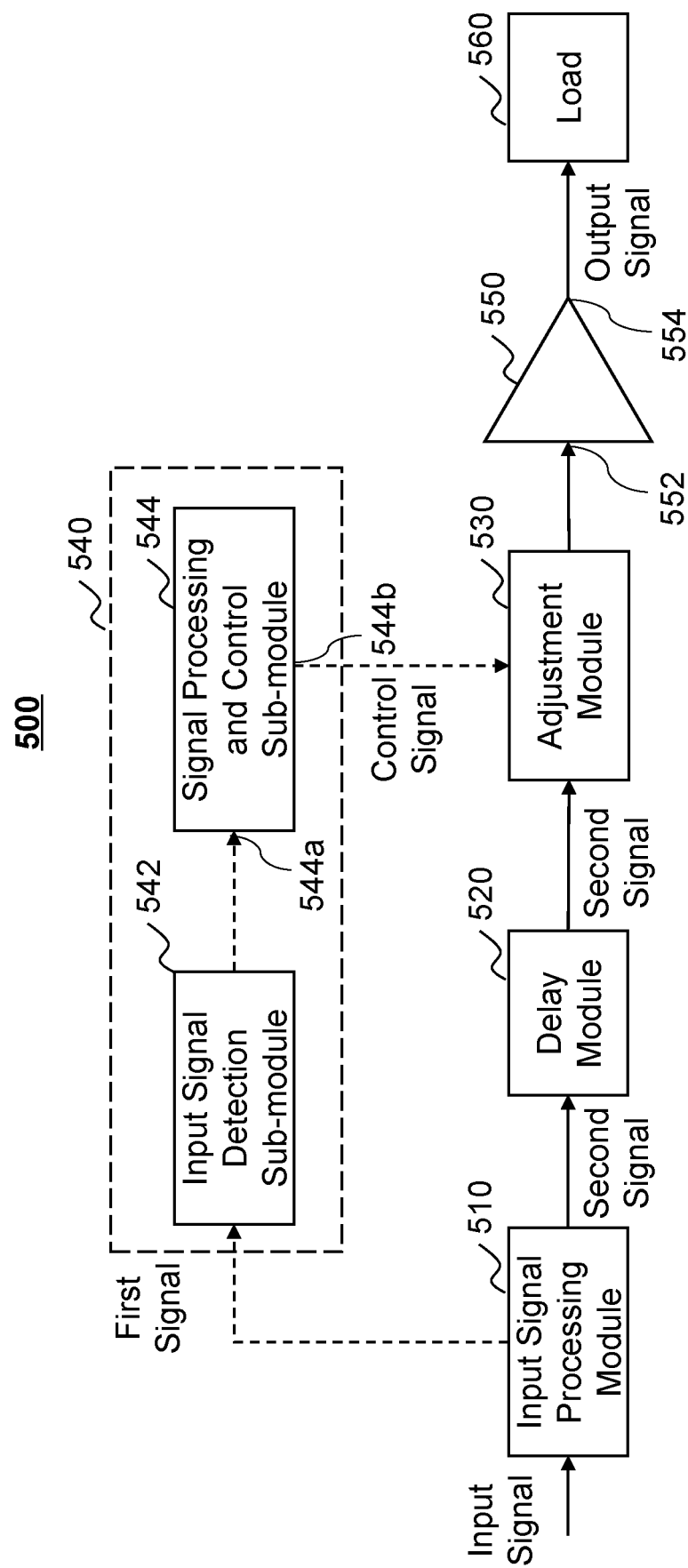
FIG. 5B is a schematic diagram illustrating an exemplary radio frequency power amplifier (RFPA) according to some embodiments of the present disclosure.

FIG. 5A is a schematic diagram illustrating an exemplary radio frequency power amplifier (RFPA) control device 505 according to some embodiments of the present disclosure. FIG. 5B is a schematic diagram illustrating an exemplary radio frequency power amplifier (RFPA) 500 according to some embodiments of the present disclosure. The RFPA 500 may include a RFPA control device (e.g., the RFPA control device 505 as illustrated in FIG. 5A), a radio frequency power amplification module 550, and a load 560. The RFPA control device 505 may be configured to adjust an input signal to implement a nonlinear correction of the radio frequency power amplification module 550. The radio frequency power amplification module 550 may be configured to amplify the adjusted input signal and generate an output signal. The output signal may be transmitted to the load 560 (e.g., RF coils). Unless otherwise stated, like reference numerals in FIGS. 5A and 5B refer to like components having the same or similar functions.

As shown in FIGS. 5A and 5B, the RFPA control device 505 may include an input signal processing module 510, a delay module 520, an adjustment module 530, and a signal processing and a control module 540. The connection of the modules of the RFPA control device 505 may be the same as the modules of the RFPA control device 405. The functions of the input signal processing module 510, the delay module 520, the adjustment module 530, and the signal processing and control module 540 may be the same as or similar to the functions of the input signal processing module 410, the delay module 420, the adjustment module 430, and the signal processing and control module 440, and the relevant descriptions are not repeated herein.

As shown in FIGS. 5A and 5B, the signal processing and control module 540 may further include an input signal detection sub-module 542 and a signal processing and control sub-module 544. The input signal detection sub-module 542 may be connected to the input signal processing module 510. The signal processing and control sub-module 544 may include a first end 544*a* and a second end 544*b*. The first end 544*a* may be connected to the input signal detection sub-module 542. The second end 544*b* may be connected to the adjustment module 530.

The input signal detection sub-module 542 may be configured to detect the at least one feature of the first signal. The at least one feature of the first signal may include amplitude, phase, or the like. In some embodiments, the at least one feature may only include amplitude. Alternatively, the at least one feature may only include phase. Alternatively, the at least one feature may include amplitude and phase. The input signal detection sub-module 542 may detect the amplitude and/or phase of the first signal, and transmit the detected amplitude and/or detected phase of the first signal into the signal processing and control sub-module 544.

In some embodiments, the input signal detection sub-module 542 may be a device configured to detect the at least one feature of the first signal. The input signal detection sub-module 542 may include a detector, a diode, a phase discriminator, or the like, or any combination thereof. For example, the detector may be used to detect the amplitude of the first signal. The phase discriminator may be used to detect the phase of the first signal. In some embodiments, the input signal detection sub-module 542 may be a signal detection circuit. For example, the at least one feature of the first signal may include the amplitude of the first signal. The signal detection circuit may detect the at least one feature (i.e., the amplitude) of the first signal via a envelope-demodulation. As another example, the at least one feature of the first signal may include the phase of the first signal. The signal detection circuit may detect the at least one feature (i.e., the phase) of the first signal via a direct radio frequency sampling.

The signal processing and control sub-module 544 may be configured to generate the control signal based on the at least one feature of the first signal. The control signal may be used to control the degree of the adjustment of the at least one feature of the second signal. In some embodiments, the signal processing and control sub-module 544 may determine the amplitude of the input signal based on the amplitude of the first signal. The signal processing and control sub-module 544 may determine the degree of the adjustment of the amplitude of the second signal based on the amplitude of the input signal and user's demand (e.g., a required amplitude of the output signal outputted by the radio frequency power amplification module 550). For example, the amplification function of the radio frequency power amplification module 550 may be determinate. To obtain the required amplitude of the output signal, a correction function may be determined based on the amplification function. The degree of the adjustment of the amplitude of the second signal may be determined based on the amplitude of the input signal and the correction function. In some embodiments, the degree of the adjustment of the phase of the second signal may be determined based on the degree of the adjustment of the amplitude of the second signal. The signal processing and control sub-module 544 may determine the degree of the adjustment of the phase of the second signal based on the degree of the adjustment of the amplitude of the second signal. Thus, the signal processing and control sub-module 544 may generate the control signal based on the degree of adjustment of the amplitude and/or phase of the second signal.

The control signal may be applied to the adjustment module 530, and configured to control the degree of adjustment of the amplitude and/or phase of the second signal. The amplitude and/or phase of the second signal may be adjusted by the adjustment module 530, and further be amplified by the radio frequency power amplification module 550 to generate a required output signal. In the present disclosure, before the radio frequency power amplification module 550 amplifies the second signal (e.g., before amplifying the amplitude and/or phase of the second signal), the adjustment module 530 may adjust and/or correct (e.g., nonlinearly correct) the second signal (e.g., the amplitude and/or phase of the second signal) to ensure that the output signal (e.g., the amplitude and/or phase of the output signal) satisfies user's demands. In some embodiments, the second signal is relatively small before the amplification, and thus, it is easy to achieve the adjustment and correction.

In some embodiments, the delay module 520 may adjust a time difference between the moment that the second signal reaches the adjustment module 530 and the moment that the control signal reaches the adjustment module 530. In some embodiments, the time difference may be 0, several nanoseconds (e.g., 5 nanoseconds, 10 nanoseconds), several microseconds (e.g., 0.01 microsecond, 0.05 microseconds), or the like. When the time difference is 0, the control signal and the second signal may simultaneously reach the adjustment module 530. When the time difference is 0.05 microseconds, the control signal and the second signal may approximately simultaneously reach the adjustment module 530, and the imaging stability (e.g., whether there is an image artifact) of the MRI system 100 may not affected by the slightly time difference. In the present disclosure, by introducing the delay module 530 into the RFPA control device 505, it may compensate for the time difference that the control signal lags behind the second signal, thereby avoiding poor imaging stability (or even image artifact) of the MRI system 100.

In some embodiments, the delay time of the delay module 520 may be a predetermined value to delay the moment that the second signal reaches the adjustment module 530. The delay of the second signal may be greater than 0.2 microseconds. Specifically, the delay of the second signal may be 0.4 microseconds, 0.5 microseconds, 0.7 microseconds, 1 microsecond, or the like.

In some embodiments, a total transmission time from a moment that the first signal is transmitted to the signal processing and control module 540 to a moment that the control signal is transmitted to the adjustment module 530 may be composed of four transmission times, that is, a first transmission time, a second transmission time, a third transmission time, and a fourth transmission time.

In some embodiments, the first transmission time may be a time that the input signal detection sub-module 542 detects the at least one feature of the first signal. The second transmission time may be a time that the signal processing and control sub-module 544 processes the first signal and generates the control signal. The third transmission time may be a time of transmitting the control signal to the adjustment module 530. The fourth transmission time may be an adjustable delay time imposed by an adjustable delay unit of the signal processing and control sub-module.

In some embodiments, the transmission link of the second signal (i.e., the input signal processing module 510—the delay module 520—the adjustment module 530—the radio frequency power amplification module 550) may be a radio frequency (RF) transmission link. The delay module 520 may be a LC filter, a surface acoustic wave filter (SAWF), a delay line, or the like, or any combination thereof. The delay time may be determined when the delay module 520 is fabricated. Due to the radio frequency transmission link, the delay module 520 may provide an RF delay, which is a fixed value and cannot be changed in real-time. Therefore, the delay has to be preset, resulting in inaccurate delay which further leads to the time difference between the moment that the second signal reaches the adjustment module 530 and the moment that the control signal reaches the adjustment module 530 is undesirably excessively large or small.

In some embodiments, the total transmission time from a moment that the first signal is transmitted to the signal processing and control module 540 to a moment that the control signal is transmitted to the adjustment module 530 may be varied due to the situations described above. For example, for the first signals with different amplitudes or phases, the second times (i.e., a time that the signal processing and control sub-module 544 processes the first signal and generates the control signal) may be different.

In order to ensure that the control signal and the second signal roughly simultaneously reach the adjustment module 530, the signal processing and control sub-module 544 may include the adjustable delay unit. In some embodiments, the transmission link of the control signal may belong to a analog domain or a digital domain. A delay on the analog domain or the digital domain may be adjustable. The adjustable delay unit may be configured to impose an adjustable delay on the control signal to adjust the moment that the control signal reaches the adjustment module 530. In some embodiments, the adjustable delay imposed on the control signal may be the fourth transmission time. The adjustable delay unit may cooperate with the delay module 520 to ensure that the control signal and the second signal roughly simultaneously reach the adjustment module 530.

In some embodiments, the adjustable delay unit may adjust the fourth transmission time to change a time difference between the total transmission time and the delay of the second signal such that the second signal and the control signal roughly simultaneously reach the adjustment module. For example, the time difference between the total transmission time and the delay of the second signal may be expressed as Equation (1) as below:

$$T_s = T - T_0 = T - (T_1 + T_2 + T_3 + T_4), \tag{1}$$

wherein $T_s$ refers to the time difference between total transmission time and the delay of the second signal (or the time difference between the moment that the second signal reaches the adjustment module 530 and the moment that the control signal reaches the adjustment module 530); T refers to delay of the second signal; $T_0$ refers to the total transmission time; $T_1$ refers to the first transmission time; $T_2$ refers to the second transmission time; $T_3$ refers to the third transmission time; and $T_4$ refers to the fourth transmission time.

Merely by way of example, if the delay of the second signal is equal to the total transmission time (i.e., a sum of the first transmission time, the second transmission time, the third transmission time, and the fourth transmission time), the time difference between the moment that the second signal reaches the adjustment module 530 and the moment that the control signal reaches the adjustment module 530 may be 0, that is, $T_s=0$.

In the present disclosure, by adjusting the fourth transmission time by the adjustable delay unit, the time difference between the moment that the second signal reaches the adjustment module 530 and the moment that the control signal reaches the adjustment module 530 may be changed such that the second signal and the control signal may roughly simultaneously reach the adjustment module 530, which may improve the imaging stability of the MRI system 100 and avoid image artifacts.

Figure 6A:
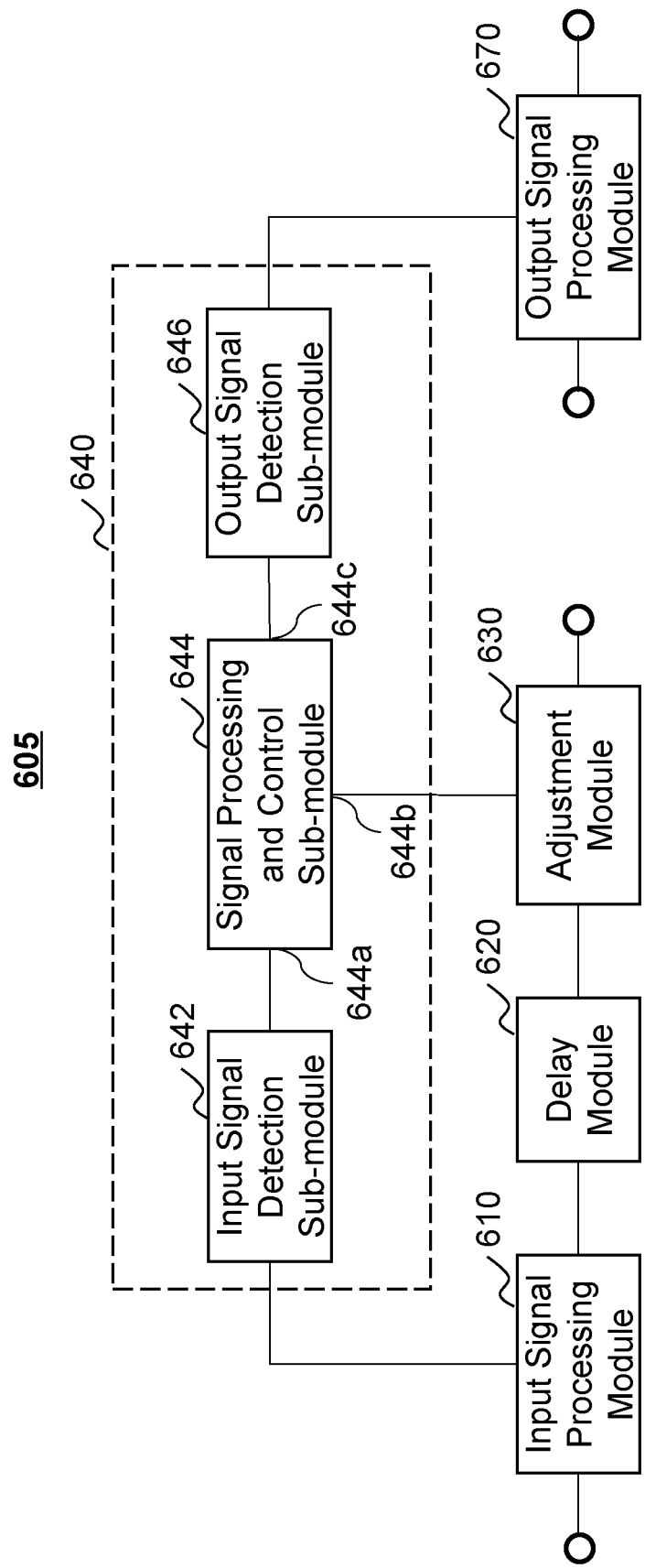
FIG. 6A is a schematic diagram illustrating an exemplary radio frequency power amplifier (RFPA) control device according to some embodiments of the present disclosure.
Figure 6B:
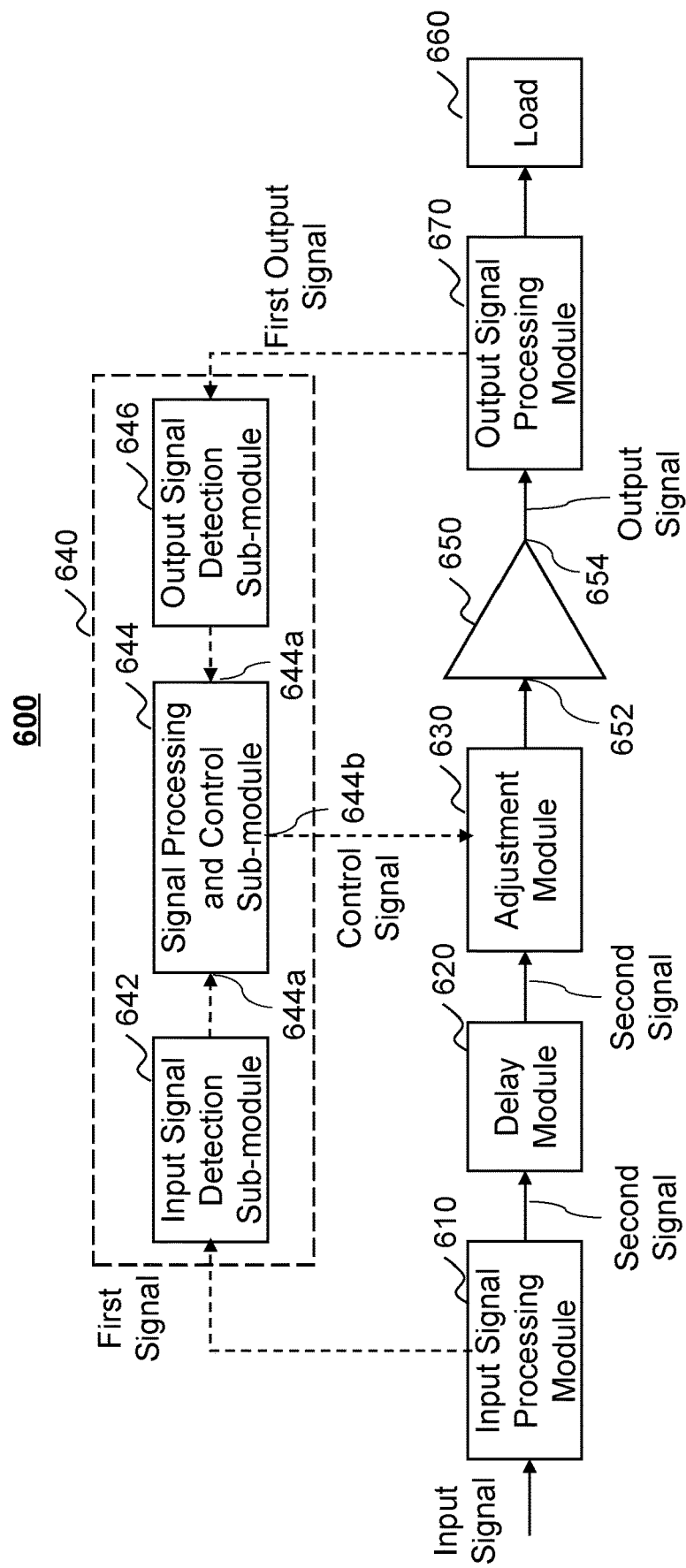
FIGS. 6B and 6C are schematic diagrams illustrating an exemplary radio frequency power amplifier (RFPA) according to some embodiments of the present disclosure.
Figure 6C:
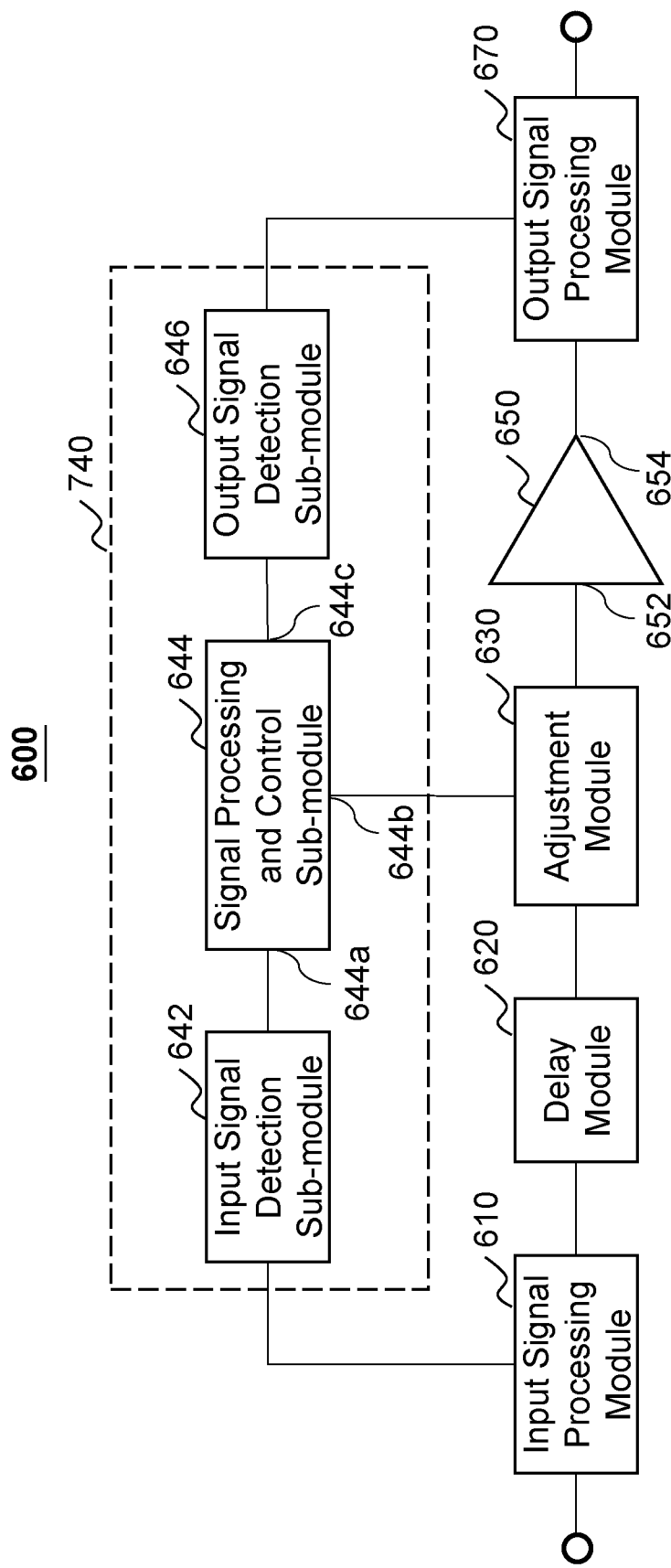

FIG. 6A is a schematic diagram illustrating an exemplary radio frequency power amplifier (RFPA) control device 605 according to some embodiments of the present disclosure. FIGS. 6B and 6C are schematic diagrams illustrating an exemplary radio frequency power amplifier (RFPA) according to some embodiments of the present disclosure. The RFPA 600 as illustrated in FIG. 6B may include a RFPA control device (e.g., the RFPA control device 605 as illustrated in FIG. 6A), a radio frequency power amplification module 650, and a load 660. The RFPA 600' as illustrated in FIG. 6C may include a RFPA control device (e.g., the RFPA control device 605 as illustrated in FIG. 6A), and a radio frequency power amplification module 650. The RFPA control device 605 may be configured to adjust an input signal to implement a nonlinear correction of the radio frequency power amplification module 650. The radio frequency power amplification module 650 may be configured to amplify the adjusted input signal and generate an output signal. The output signal may be transmitted to the load 660 (e.g., RF coils). Unless otherwise stated, like reference numerals in FIGS. 6A-6C refer to like components having the same or similar functions.

As shown in FIGS. 6A-6C, the RFPA control device 605 may include an input signal processing module 610, a delay module 620, an adjustment module 630, and a signal processing and a control module 640. The connection of the modules of the RFPA control device 605 may be the same as the modules of the RFPA control device 405. The functions of the input signal processing module 610, the delay module 620, the adjustment module 630, and the signal processing and control module 640 may be the same as or similar to the functions of the input signal processing module 410, the delay module 420, the adjustment module 430, and the signal processing and control module 440, and the descriptions are not repeated herein.

As described in connection with FIGS. 5A and 5B, the signal processing and control module 640 may detect the at least one feature of the first signal, and generate the control signal based on the feature of the first signal and the feature of the output radio frequency signal desired by the user (e.g., the feature of a required output signal). The adjustment module 630 may adjust the at least one feature of the second signal based on the control signal, and the radio frequency power amplification module 650 may further amplify the at least one feature of the second signal to generate the output signal. However, in some cases, the actual output signal generated by the radio frequency power amplification module 650 may be different from the required output signal (e.g., a small error exists). That is, the detection of the first signal alone may not achieve the accurate nonlinear correction of the radio frequency power amplification module 650. In some embodiments, to eliminate the small error between the actual output signal and the required output signal, the output radio frequency signal (i.e., the actual output signal) needs to be processed further by an output signal processing module 670, and accordingly, the control signal may be adjusted based on the processed output signal.

In some embodiments, the RFPA control device 605 may further include the output signal processing module 670. The output signal processing module 670 may be connected to the radio frequency power amplification module 650. The output signal processing module 670 may be configured to process the output signal (i.e., the actual output signal) into at least two output signals. A first output signal of the at least two output signals may be used for signal detection, and a second output signal of the at least two output signals may be transmitted to the load 660. In some embodiments, the first output signal may be used to adjust the control signal.

As shown in FIG. 6A, the signal processing and control module 640 may include an input signal detection sub-module 642, a signal processing and control sub-module 644, and an output signal detection sub-module 646. The input signal detection sub-module 642 may be connected to the input signal processing module 610. The output signal detection sub-module 646 may be connected to the output signal processing module 670. The signal processing and control sub-module 644 may include a first end 644a, a second end 644b, and a third end 644c. The first end 644a may be connected to the input signal detection sub-module 642. The second end 644b may be connected to the adjustment module 630. The third end 644c may be connected to the output signal detection sub-module 646.

In some embodiments, the input signal detection sub-module 642 may be configured to detect the at least one feature of the first signal (also referred to as first input signal) and transmit the first signal to the signal processing and control sub-module 644. The output signal detection sub-module 646 may be configured to detect at least one feature of the first output signal and transmit the first output signal to the signal processing and control sub-module 644. The signal processing and control sub-module 644 may determine the control signal based on the at least one feature of the first signal and the at least one feature of the first output signal. For example, the signal processing and control sub-module 644 may adjust the control signal based on an error between the at least one feature of the first signal and the at least one feature of the first output signal. The control signal may be used to control the degree of the adjustment of the at least one feature of the second signal.

The at least one feature of the first signal and/or the first output signal may include amplitude, phase, or the like, or any combination thereof. In some embodiments, the signal processing and control sub-module 644 may determine the amplitude of the input signal based on the amplitude of the first signal. The signal processing and control sub-module 644 may determine the amplitude of the output signal based on the amplitude of the first output signal. The signal processing and control sub-module 644 may determine the degree of the adjustment of the amplitude of the second signal based on the amplitude of the input signal, the amplitude of the actual output signal, and the user's demand (e.g., the amplitude of the required output signal). The signal processing and control sub-module 644 may determine the degree of the adjustment of the phase of the second signal based on the degree of the adjustment of the amplitude of the second signal. Thus, the signal processing and control sub-module 644 may generate the control signal based on the degree of adjustment of the amplitude and/or phase of the second signal. When the RFPA control device 605 works, the signal processing and control sub-module 644 may continually adjust the control signal based on the input signal (e.g., the first signal), the actual output signal (e.g., the first output signal), and the user's demand (e.g., the output signal required by the user). And the signal processing and control sub-module 644 may continually adjust the second signal based on the control signal until the required output signal is obtained.

In some embodiments of the present disclosure, the control signal may be determined or adjusted based on the feature(s) of the input signal and the feature(s) of the actual output signal. The second signal may be adjusted based on the control signal, and further be amplified by the radio frequency power amplification module 650 to generate the required output signal. The above process may form a closed-loop control, which may implement the precise nonlinear correction of the radio frequency power amplification module 650.

Figure 7:
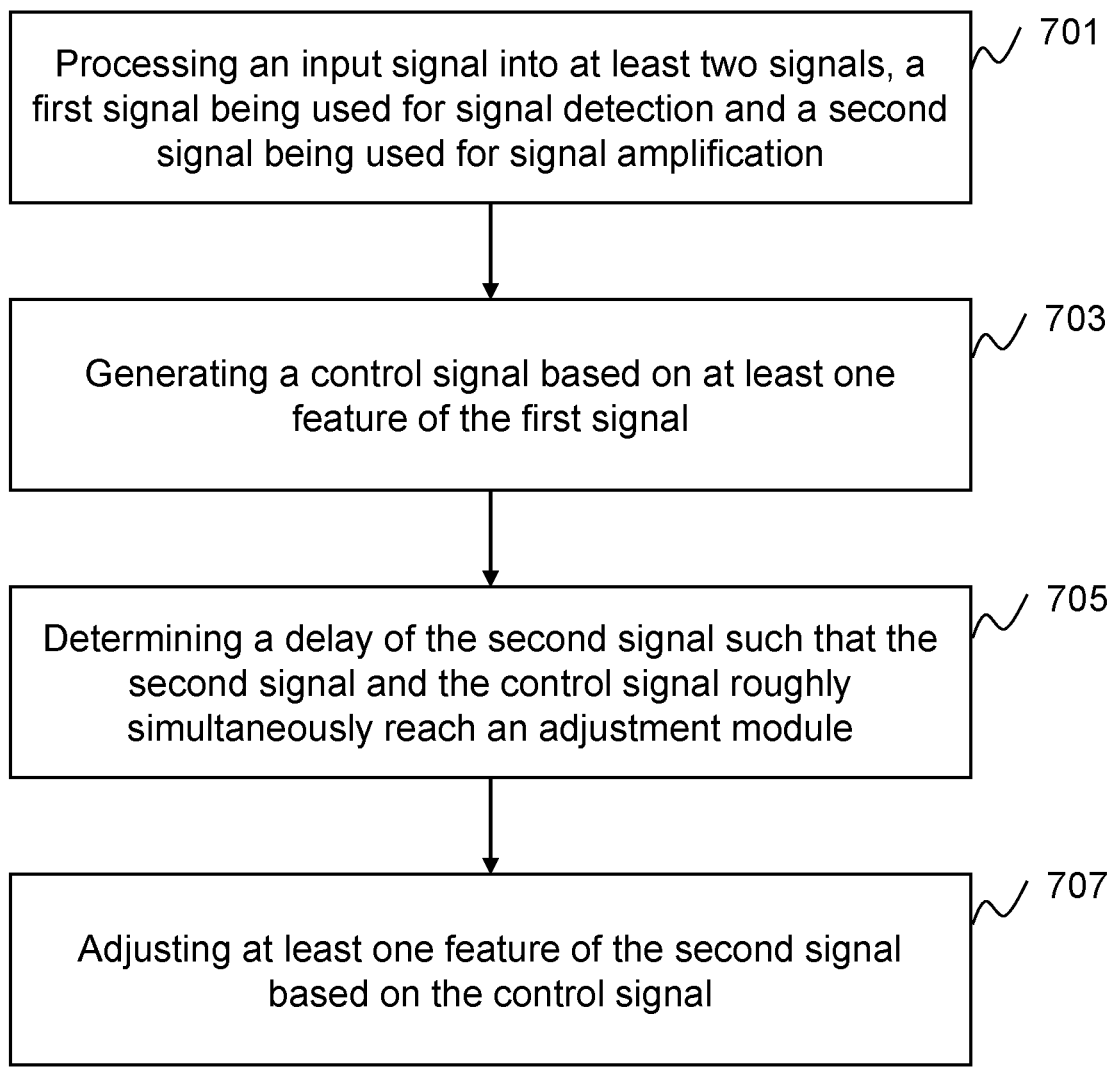
FIG. 7 is a flowchart illustrating an exemplary process for adjusting a second signal according to some embodiments of the present disclosure.

FIG. 7 is a flowchart illustrating an exemplary process for adjusting a second signal according to some embodiments of the present disclosure. For illustration purposes only, the processing device 140 may be described as a subject to perform the process 700. However, one of ordinary skill in the art would understand that the process 700 may also be performed by other entities. In some embodiments, one or more operations of process 700 may be implemented in the MRI system 100 illustrated in FIG. 1. For example, the process 700 may be stored in the storage device 150 and/or the storage 220 in the form of instructions (e.g., an application), and invoked and/or executed by one or more components of the RFPA 405 (or 505, 605) as illustrated in FIG. 4A (or FIG. 5A, FIG. 6A). The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7A and described below is not intended to be limiting.

In 701, the processing device 140 (e.g., the input signal processing module 410, the input signal processing module 510, the input signal processing module 610) may process an input signal into at least two signals. The processing device 140 may divide the input signal into two equal signals, or two unequal signals. A first signal of the at least two signals may be transmitted to a signal processing and control module (e.g., the signal processing and control module 440, the signal processing and control module 540, the signal processing and control module 640) and used for signal detection. A second signal of the at least two signals may be transmitted to a delay module (e.g., the delay module 420, the delay module 520, the delay module 620) and used for signal amplification.

In 703, the processing device 140 (e.g., the signal processing and control module 440, the signal processing and control module 540, the signal processing and control module 640) may generate a control signal based on at least feature of the first signal. The control signal may be used to control a degree of the adjustment of at least one feature of the second signal.

In some embodiments, the processing device 140 may detect the at least one feature of the first signal. The at least one feature of the first signal may include amplitude, phase, or the like, or any combination thereof. In some embodiments, the processing device 140 may detect the amplitude of the first signal via a envelope-demodulation. The processing device 140 may detect the phase of the first signal via a direct radio frequency sampling. The processing device 140 may generate the control signal based on the at least one feature of the first signal. Specifically, the processing device 140 may determine the amplitude of the input signal based on the amplitude of the first signal. The processing device 140 may determine the degree of the adjustment of the amplitude of the second signal based on the amplitude of the input signal and the amplitude of the output signal desired by the user (e.g., a required output signal). The processing device 140 may also determine the degree of the adjustment of the phase of the second signal based on the degree of the adjustment of the phase of the second signal. Thus, the processing device 140 may determine the control signal based on the degree of the adjustment of the amplitude and/or phase of the second signal.

In 705, the processing device 140 (e.g., the delay module 420, the delay module 520, the delay module 620) may determine a delay of the second signal such that the second signal and the control signal roughly simultaneously reach an adjustment module (e.g., the adjustment module 430, the adjustment module 530, the adjustment module 630). In some embodiments, the processing device 140 may adjust a time difference between the moment that the second signal reaches the adjustment module and the moment that the control signal reaches the adjustment module. In some embodiments, the time difference may be 0, several nanoseconds (2 nanoseconds, 5 nanoseconds, 10 nanoseconds), or several microseconds (e.g., 0.01 microseconds, 0.05 microseconds), or the like. More descriptions of the determination of the delay of the second signal may be found elsewhere in the present disclosure (e.g., FIGS. 5A and 5B and the relevant descriptions thereof).

In 707, the processing device 140 (e.g., the adjustment module 430, the adjustment module 530, the adjustment module 630) may adjust at least one feature of the second signal based on the control signal. The at least one feature of the second signal may include amplitude, phase, or the like, or any combination thereof. In some embodiments, the processing device 140 may adjust the amplitude of the second signal. Alternatively, the processing device 140 may adjust the phase of the second signal. Alternatively, the processing device 140 may adjust the amplitude and the phase of the second signal.

In some embodiments, the processing device 140 (e.g., the radio frequency power amplification module 450, the radio frequency power amplification module 550, the radio frequency power amplification module 650) may amplify the adjusted second signal to generate an output signal. In some embodiments, the processing device 140 (e.g., the output signal processing module 670) may process the output signal into at least two output signals. A first output signal of the at least two output signals may be used for signal detection, and a second output signal of the at least two output signals may be transmitted to a load (e.g., RF coils). In some embodiments, the first output signal may be used to adjust the control signal. For example, the processing device 140 may detect at least one feature of the first output signal. The at least one feature of the first output signal may include amplitude, phase, or the like, or any combination thereof. The processing device 140 may determine the control signal based on the at least one feature of the first signal and the at least one feature of the first output signal.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, operations 703 and 705 may be performed simultaneously. As another example, operation 705 may be performed before operation 703.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A control device of a radio frequency power amplifier in a magnetic-resonance imaging (MRI) system, coupled to a radio frequency power amplification module of the radio frequency power amplifier via a signal connection, the control device comprising:

an input signal processing module, configured to process an MRI radio frequency input signal into at least two signals, wherein a first signal of the at least two signals is used for signal detection, and a second signal of the at least two signals is used for signal amplification;

a signal processing and control module, configured to receive the first signal and output a control signal, wherein the control signal controls a degree of the adjustment of the second signal;

an adjustment module configured to adjust, based on the control signal, an amplitude and/or a phase of the second signal; and a delay module comprising a surface acoustic wave filter, disposed between the input signal processing module and the adjustment module, configured to determine a delay of the second signal, wherein the signal processing and control module is further configured to impose an adjustable delay on the control signal, so as to cooperate with the delay module to ensure that the control signal and the second signal simultaneously reach the adjustment module.

2. The control device of claim 1, wherein:

the adjustment module is connected to the input signal processing module and the radio frequency power amplification module, respectively; and the signal processing and control module is connected to the input signal processing module and the adjustment module, respectively, configured to generate the control signal based on at least one feature of the first signal, wherein the control signal is configured to control a degree of the adjustment of the at least one feature of the second signal.

3. The control device of claim 2, wherein the signal processing and control module further comprises:

an input signal detection sub-module, connected to the input signal processing module, configured to detect the at least one feature of the first signal; and a signal processing and control sub-module, connected to the input signal detection sub-module and the adjustment module, respectively, configured to generate the control signal based on the at least one feature of the detected first signal.

4. The control device of claim 3, wherein the input signal detection sub-module includes at least one of a detector, a diode, or a phase discriminator.

5. The control device of claim 3, wherein a total transmission time from a moment that the first signal is transmitted to the signal processing and control module to a moment that the control signal is transmitted to the adjustment module is composed of a first transmission time, a second transmission time, a third transmission time, and a fourth transmission time, wherein:

the first transmission time is a time that the input signal detection sub-module detects the at least one feature of the first signal;

the second transmission time is a time that the signal processing and control sub-module processes the first signal and generates the control signal;

the third transmission time is a time of transmitting the control signal to the adjustment module; and the fourth transmission time is an adjustable delay time imposed by an adjustable delay unit of the signal processing and control sub-module.

6. The control device of claim 5, wherein the adjustable delay unit adjusts the fourth transmission time to change a time difference between the total transmission time and the delay of the second signal such that the second signal and the control signal roughly simultaneously reach the adjustment module.

7. The control device of claim 2, wherein the at least one feature of the first signal includes amplitude and/or phase.

8. The control device of claim 2, wherein the radio frequency power amplification module is configured to receive and amplify the adjusted second signal to generate an output signal.

9. The control device of claim 8, further comprising an output signal processing module, connected to the radio frequency power amplification module, configured to process the output signal into at least two output signals, wherein a first output signal of the at least two output signals is used for signal detection, and a second output signal of the at least two output signals is transmitted to a load.

10. The control device of claim 9, wherein the signal processing and control module further includes an output signal detection sub-module, connected to a signal processing and control sub-module of the signal processing and control module, wherein the output signal detection sub-module is configured to detect at least one feature of the first output signal; and the signal processing and control sub-module is connected to the adjustment module and configured to generate the control signal based on the at least one feature of the first signal and the at least one feature of the first output signal.

11. The control device of claim 10, wherein the signal processing and control sub-module is further configured to adjust the control signal based on the amplitude of the first signal, the amplitude of the first output signal, and a user's demand.

12. The control device of claim 1, wherein the delay of the second signal is longer than 1 microsecond.

13. A method for controlling a radio frequency power amplifier in a magnetic resonance imaging (MRI) system, implemented on a computing device including at least one processor, at least one storage device, and a communication platform connected to a network, comprising:

processing, by an input signal processing module, an MRI radio frequency input signal into at least two signals, wherein a first signal of the at least two signals is used for signal detection, and a second signal of the at least two signals is used for signal amplification;

generating, by a signal processing and control module, a control signal based on at least one feature of the first signal;

determining, by a delay module comprising a surface acoustic wave filter, a delay of the second signal; and adjusting, by an adjustment module based on the control signal, an amplitude and/or a phase of the second signal;

wherein the method further comprises:

imposing, by the signal processing and control module, an adjustable delay on the control signal, so as to cooperate with the delay module to ensure that the control signal and the second signal simultaneously reach the adjustment module.

14. The method of claim 13, wherein the generating a control signal based on at least one feature of the first signal comprises:
  detecting the at least one feature of the first signal; and
  generating the control signal based on the at least one feature of the detected first signal.

15. The method of claim 13, further comprising:
  amplifying, by a radio frequency power amplification module of the radio frequency power amplifier, the adjusted second signal to generate an output signal.

16. The method of claim 15, further comprising:
  processing, by an output signal processing module, the output signal into at least two output signals, wherein a first output signal of the at least two output signals is used for signal detection, and a second output signal of the at least two output signals is transmitted to a load.

17. The method of claim 16, wherein the generating a control signal based on at least one feature of the first signal comprises:
  detecting at least one feature of the first output signal; and
  generating the control signal based on the at least one feature of the first signal and the at least one feature of the first output signal.

18. A radio frequency power amplifier, comprising:
  a control device of the radio frequency power amplifier in a magnetic-resonance imaging (MRI) system, coupled to a radio frequency power amplification module of the radio frequency power amplifier via a signal connection, wherein the control device comprises:
    an input signal processing module, configured to process an MRI radio frequency input signal into at least two signals, wherein a first signal of the at least two signals is used for signal detection, and a second signal of the at least two signals is used for signal amplification;
    a signal processing and control module, configured to receive the first signal and output a control signal, wherein the control signal controls a degree of the adjustment of the second signal;
    an adjustment module configured to adjust, based on the control signal, an amplitude and/or a phase of the second signal; and
  a delay module comprising a surface acoustic wave filter, disposed between the input signal processing module and the adjustment module, configured to determine a delay of the second signal, wherein
    the signal processing and control module is further configured to impose an adjustable delay on the control signal, so as to cooperate with the delay module to ensure that the control signal and the second signal simultaneously reach the adjustment module; and
  the radio frequency power amplification module configured to receive and amplify the second signal to generate an output signal.

* * * * *